Figure 1:
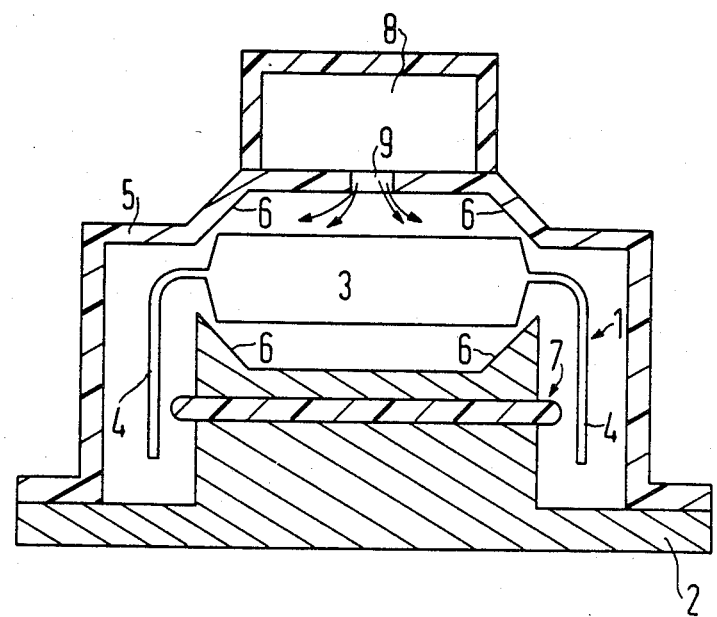

United States Patent [19]

Walther

[11] Patent Number: 4,709,297

[45] Date of Patent: * Nov. 24, 1987

[54] GUIDING DEVICE FOR SEMICONDUCTOR COMPONENTS WITH DIL CASINGS

[75] Inventor: Albert Walther, Holzkirchen, Fed. Rep. of Germany

[73] Assignee: Siemens Aktiengesellschaft, Berlin and Munich, Fed. Rep. of Germany

[*] Notice: The portion of the term of this patent subsequent to Jan. 21, 2003 has been disclaimed.

[21] Appl. No.: 747,112

[22] Filed: Jun. 20, 1985

[30] Foreign Application Priority Data

Jun. 29, 1984 [DE] Fed. Rep. of Germany ....... 3424048

[51] Int. Cl.$^4$ ........................ H02H 1/00; B65D 73/02
[52] U.S. Cl. ..................................... 361/212; 206/328
[58] Field of Search ............................... 361/212–220; 206/328, 331, 332, 334

[56] References Cited

U.S. PATENT DOCUMENTS

| 4,037,267 | 7/1977 | Kisor | 206/331 X |
| 4,327,832 | 5/1982 | de Matteo | 361/220 X |
| 4,353,481 | 10/1982 | Tando | 206/328 X |
| 4,565,288 | 1/1986 | Walther | 361/220 X |
| 4,590,534 | 5/1986 | Akamatsu et al. | 361/220 X |

FOREIGN PATENT DOCUMENTS

| 0101058 | 8/1983 | European Pat. Off. . |
| 3039782 | 5/1981 | Fed. Rep. of Germany . |
| 3230075 | 2/1984 | Fed. Rep. of Germany ...... 206/328 |
| 2468284 | 4/1981 | France . |
| 79/00066 | 12/1979 | PCT Int'l Appl. . |

Primary Examiner—L. T. Hix
Assistant Examiner—David M. Gray
Attorney, Agent, or Firm—Herbert L. Lerner

[57] ABSTRACT

A guiding device for semiconductor components with DIL casings having edges and surfaces adjoining the edges includes a housing, means disposed in the housing for protecting the semiconductor components against electrostatic charging and discharging, the housing having at least one guiding surface extending in longitudinal direction of the housing being inclined relative to the casing surfaces adjoining the casing edges preventing surface friction and limiting contact between the housing and the casing to contact regions between the guiding surface and the casing edges.

13 Claims, 2 Drawing Figures

GUIDING DEVICE FOR SEMICONDUCTOR COMPONENTS WITH DIL CASINGS

The invention relates to a guiding device for semiconductor components with DIL (dual-in-line) casings, in which provisions for protection against electrostatic charges and discharges are made.

As is well known, an electrostatic charge or discharge is frequently the cause of damage to or destruction of, a semiconductor component. Electrostatically endangered components must therefore be protected against damage due to charges occurring during transport, during storage and while in the guides of machines, such as automatic devices for filling in sticks or bars for magazines, automatic insertion machines, or stamping machines. A conventional protective measure is to provide the guides in such machines with a thin high-resistance coating.

However, over the course of time, such a coating can lose its protective action by abrasion or evaporation. Another disadvantage is an undesirable dependence on the ambient air humidity. Furthermore, weakening of the protection cannot be discerned visually, so that simple monitoring is not possible. In addition, halogens, nitrates or sulfates frequently contained in the antistatic material promote corrosion of the metallic component leads.

German Published, Non-Prosecuted application DE-OS No. 30 39 782 describes a bar magazine for receiving a stick or bar of components. These are therefore given low-friction guidance which thus prevents tripoelectric charging, since a rib with a triangular cross section extending in the longitudinal direction is disposed on at least one inside wall.

However, in order to preclude any large-area friction contact between the components and the container walls, a large number of such ribs is required, especially in so-called DIL (dual-in-line) casings. Special attention must be given in this case to the lead legs, so that they remain out of contact with the container walls as far as possible. Nevertheless, the danger continues to exist in such a magazine that the located semiconductor components located inside can be damaged by an external discharge through the container walls.

It is accordingly an object of the invention to provide a guiding device for semiconductor components with DIL casings, which overcomes the hereinafore-mentioned disadvantages of the heretofore-known devices of this general type, with improved protection properties.

With the foregoing and other objects in view there is provided, in accordance with the invention, a guiding device for semiconductor components with DIL casings having edges, surfaces adjoining the edges and two opposite rows of contact pins protruding therefrom, comprising a housing, means disposed in the housing for protecting the semiconductor components against electrostatic charging and discharging in the form of a high-resistance charge collector for connecting the two opposite rows of contact pins, the housing having at least one guiding surface extending in longitudinal direction of the housing being inclined relative to the casing surfaces adjoining the casing edges preventing surface friction and limiting contact between the housing and the casing to contact regions between the guiding surface and the casing edges, and a gas canal having openings formed therein through which ionized gas or gas with increased air humidity is blown in vicinity of the contact regions.

The advantage of this construction is that a guidance of the components is achieved which limits contact with the container to a minimum without requiring the formation of a multiplicity of individual sliding ridges. The guide according to the invention keeps excessively large external discharge currents which may be caused by electrostatically charged persons, away from the components. It also largely prevents tripoelectric charging. Trouble-free loading and emptying of the guiding device is assured because of its good sliding properties. A further advantage of the invention is that the build-up of a major potential difference is prevented by continuous charge equalization between the component leads. Damage to the components by discharges outside the container is impossible due to the disposition and structure of the discharge path. Besides minimizing the contact areas between the chargeable plastic casings of the components and the guide parts, a construction of the guide according to the invention also permits an adjustment of the probability of contact, the contact pressure and an impediment to sliding. The structure of the invention also permits a targeted local increase of the relative air humidity in the critical sliding regions of components and guides.

In accordance with another feature of the invention, the at least one guiding surface is in the form of four guiding surfaces.

In accordance with an added feature of the invention, the the four guiding surfaces are planar and are in the form of two pairs of mutually parallel surfaces.

In accordance with a further feature of the invention, the at least one guiding surface is concave.

In accordance with an additional feature of the invention, the charge collector is also a spacer for the lead pins.

Other features which are considered as characteristic for the invention are set forth in the appended claims.

Although the invention is illustrated and described herein as embodied in a guiding device for semiconductor components with DIL casings, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying FIGS.

Figure 2:
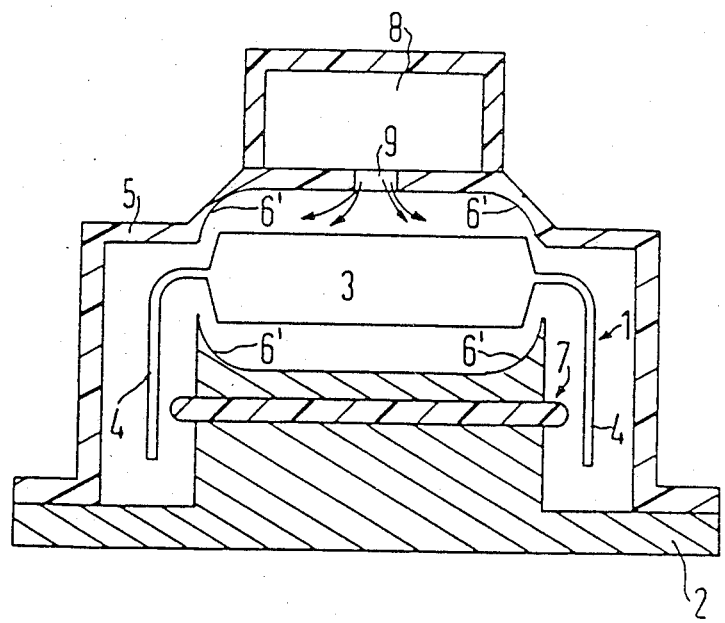

FIGS. 1 and 2 are diagrammatic, cross-sectional views of two embodiments of a guiding device according to the invention.

Referring now to the FIGS. of the drawing in detail, there is seen a tubular guiding device which contains a semiconductor component 1. The guiding device is suited for picking up a multiplicity of such components aligned in the interior thereof. Access to the components is possible through non-illustrated openings at both ends of the guide.

The semiconductor component 1 has a plastic casing 3 and two rows of metallic pins 4 which protrude laterally from the casing, which are inclined downward and which form electrical connections to integrated circuits located in the interior thereof. This structure is known as a dual-in-line (DIL) casing. The casing 3 is characterized by four edges extending in the longitudinal direction of the guide.

The guiding device is formed of a housing with a lower part 2, preferably made of metal, and a plastic upper part 5 which is detachably connected thereto. In order to reduce friction areas between the component 1 and the guiding device, the lower part 2 and the upper part 5 are provided with guiding surfaces 6 extending in the longitudinal direction. The arrangement and position of the guiding surfaces relative to the component 1 prevents the development of a large-area contact. The surfaces 6 are inclined relative to the areas of the casing adjacent the casing edges, in such a manner that only a contact which is limited to the casing edges can be produced. In the illustrated embodiment, the lower and the upper parts 2, 5, respectively, are constructed in the form of a trapezoid, the angle of inclination of the guiding surfaces 6 being about 45°. The width of the guiding surfaces 6 must be so large that the desired edge contact is maintained even if the casing 3 executes transverse or tilting motions, which cannot be completely precluded because of the required play.

The channel formed by the guiding surfaces 6 can also have a V-shaped construction or concave surfaces 6' shown in FIG. 2. Due to the last-mentioned feature, the angle of inclination which is determined by a tangent to the radius of curvature, is not constant. It is particularly advantageous if the walls of the upper part 5 extend into the corresponding regions so that the inner surfaces thereof form the surfaces 6. A charge collector 7 is disposed in vicinity of the contact pins 4. On one hand, the charge collector 7 serves as a guide and spacer and on the other hand, it serves for charge equalization between the rows of pins. For this purpose, the charge collector is made of high-resistance ($10^6$ to $10^8$ Ohms) material.

A gas canal 8 extends along the upper part 5 of the guides, from which ionized gas is blown through openings 9 and onto the contact points between the components 1 and the guiding surfaces 6. The gas canal 8 also achieves a brief local increase of the relevant air humidity in vicinity of the dew point, in the sliding areas of the component. During the gas feed, the inclined guiding surfaces 6 also serve for conducting the gas stream.

The foregoing is a description corresponding in substance to German Application P 34 24 048.9, dated June 29, 1984, the International priority of which is being claimed for the instant application, and which is hereby made part of this application. Any material discrepancies between the foregoing specification and the aforementioned corresponding German application are to be resolved in favor of the latter.

I claim:

1. Guiding device for semiconductor components with DIL casings having edges and surfaces adjoining the edges, comprising a housing, means disposed in said housing for protecting the semiconductor components against electrostatic charging and discharging, said housing having at least one guiding surface extending in longitudinal direction of said housing being inclined relative to the casing surfaces adjoining the casing edges preventing surface friction and limiting contact between said housing and the casing to contact regions between said guiding surface and the casing edges.

2. Guiding device according to claim 1, wherein said at least one guiding surface is in the form of four guiding surfaces.

3. Guiding device according to claim 2, wherein said four guiding surfaces are planar and are in the form of two pairs of mutually parallel surfaces.

4. Guiding device according to claim 1, wherein said at least one guiding surface is concave.

5. Guiding device according to claim 2 wherein said at least one guiding surface is concave.

6. Guiding device for semiconductor components with DIL casings having two opposite rows of lead pins protruding therefrom, comprising means for protecting the semiconductor component against electrostatic charging and discharging, in the form of a high-resistance charge collector for connecting the two opposite rows of lead pins of the semiconductor component.

7. Guiding device according to claim 6, wherein said charge collector is also a spacer for the lead pins.

8. Guiding device for semiconductor components with DIL casings, comprising a housing having a region for contacting the casings, means disposed in said housing for protecting the casings against electrostatic charging and discharging, and a gas canal having openings formed therein through which gas is blown in vicinity of said contact region.

9. Guiding device according to claim 8, wherein said gas is ionized.

10. Guiding device according to claim 8, wherein said gas has increased humidity.

11. Guiding device for semiconductor components with DIL casings having edges, surfaces adjoining the edges and two opposite rows of contact pins protruding therefrom, comprising a housing, means disposed in said housing for protecting the semiconductor components against electrostatic charging and discharging in the form of a high-resistance charge collector for connecting the two opposite rows of contact pins, said housing having at least one guiding surface extending in longitudinal direction of said housing being inclined relative to the casing surfaces adjoining the casing edges preventing surface friction and limiting contact between said housing and the casing to contact regions between said guiding surface and the casing edges, and a gas canal having openings formed therein through which gas is blown in vicinity of said contact regions.

12. Guiding device according to claim 11, wherein said gas is ionized.

13. Guiding device according to claim 11, wherein said gas has increased humidity.

* * * * *